(12) United States Patent
Lizotte

(10) Patent No.: US 7,364,838 B2
(45) Date of Patent: Apr. 29, 2008

(54) GRAY LEVEL IMAGING MASKS, OPTICAL IMAGING APPARATUS FOR GRAY LEVEL IMAGING MASKS AND METHODS FOR ENCODING MASK AND USE OF THE MASKS

(75) Inventor: Todd E. Lizotte, Manchester, NH (US)

(73) Assignee: Hitachi Via Mechanics, Ltd., Ebina-shi, Kanagawa (JP)

( * ) Notice: Subject to any disclaimer, the term of this patent is extended or adjusted under 35 U.S.C. 154(b) by 71 days.

(21) Appl. No.: 11/169,384

(22) Filed: Jun. 29, 2005

(65) Prior Publication Data

US 2005/0260508 A1    Nov. 24, 2005

(51) Int. Cl.
*G03F 7/00*    (2006.01)
(52) U.S. Cl. .......................................... 430/321; 430/5
(58) Field of Classification Search .................... None
See application file for complete search history.

(56) References Cited

U.S. PATENT DOCUMENTS 6,420,073 B1 * 7/2002 Suleski et al. ................. 430/5

2002/0160545 A1 * 10/2002 Anderson et al. ............. 438/22

* cited by examiner

*Primary Examiner*—John A. McPherson
*Assistant Examiner*—Deborah Chacko-Davis
(74) *Attorney, Agent, or Firm*—Davis Bujold & Daniels, P.L.L.C.

(57) ABSTRACT

A grayscale mask for imaging operations, including a substrate layer and a mask layer having a plurality of apertures forming a mask pattern to form a grayscale image. Each edge of each aperture includes a plurality segments forming a serrated edge, resulting in mixed edge diffraction. The apertures may be in an irregular and non-symmetric pattern and may be of variable size. A random diffusing layer may be in proximity to or integral with the substrate layer. The grayscale mask may be used for generating an optical element by printing the initial grayscale mask onto a photoresist layer and transferring the photoresist pattern onto a transparent layer and the mask may include areas or layers of variable transmission. Also described are methods for diffractive intensity averaging, diffractive error diffusion, diffractive spatial dithering, and diffractive intensity averaging.

11 Claims, 19 Drawing Sheets

GRAY LEVEL IMAGING MASKS, OPTICAL IMAGING APPARATUS FOR GRAY LEVEL IMAGING MASKS AND METHODS FOR ENCODING MASK AND USE OF THE MASKS

CROSS REFERENCES TO RELATED APPLICATIONS

The present Patent Application is related to and claims benefit of U.S. patent application Ser. No. 10/464,017 filed Jun. 18, 2003 which claims benefit of U.S. Provisional Patent Application Ser. No. 60/395,725 for GRAY LEVEL IMAGING MASKS, OPTICAL IMAGING APPARATUS FOR GRAY LEVEL IMAGING MASKS AND METHODS FOR ENCODING AND USING GRAY LEVEL IMAGING MASKS, filed Jul. 11, 2002 by Todd E. Lizotte and assigned to the assignee of the present Application.

FIELD OF THE INVENTION

The present invention is directed to a gray level imaging mask and to methods for encoding and using such gray level imaging masks and to apparatus for creating and using such masks and, in particular, to the manufacture and use of such masks for use in the manufacturing of micro-mechanical structures, devices and micro-optical components such as diffractive, refractive and holographic (CGH) optics.

BACKGROUND OF THE INVENTION

Recent developments in micro-electro-mechanical systems, also referred to as MEMS, have resulted in progressively more complex and capable MEMS componets and has seen the incorporation and integration of such components, such as optics, micro-optics, microelectronics, micromechanics and semiconductor technologies into progressively more advanced micro-systems for a wide range of purposes and applications. A common need among such components systems, however, is the need to create optical structures, components and devices into or onto such MEMS devices and systems wherein such optical structures, components and devices involve and require the generation and implementation of intricate three-dimensional contours, optical radii and mathematically derived curves and diffractive or holographic structures.

The use of gray scale or gray tone techniques is advantageous in various imaging, printing, etching and machining processes used in creating MEMs components and systems and various optical devices or structures. These advantagous include, for example, the ability to form complex three-dimensional shapes into photo sensitive materials, specifically photo resists, as used in semiconductor manufacturing type processes. The formation of complex three-dimensional structures requires, however, a gray scale or gray tone photo mask or lithography mask which such masks have variations in transmission, either formed by stacking special coatings, etching the surface to selectively change the surface roughness or by changing the physical characteristics of the bulk mask material by electron beam writing. In all cases the methods are expensive and require specialized software processes, materials and techniques to generate the artwork or to process the mask blanks.

The fundamental theories and principles of gray scale or gray level images and processes have been clearly expressed in such publications as Gray Level Mask Theory (Prior Art) Wolfgang Henke, et al. Jpn J. Appl. Phys. Vol 33 (1994) pp. 6809-6815. Wolfgang Henke, et al, (1) illustrated the physical concept underlying gray level or gray tone concepts by describing how the projection imaging system of a wafer stepper acts as a spatial frequency filter. The amplitude in the image plane of the projection system is obtained from the mask amplitude transmission function T(x), which takes values of 0 or 1 behind opaque and transparent mask regions, respectively, in the following manner. The effect of a diffraction-limited optical system, i.e., no aberrations and no defocus, is to cut off higher spatial frequencies in the Fourier spectrum T'(k) of T(x). T'(k) and T(x) are related through the equations $$T(x) = \int T'(k) \cdot \exp(ikx) dk \quad (1)$$

$$T'(k) = \frac{1}{2\pi} \cdot \int T(x) \cdot \exp(-ikx) dk \quad (2)$$

The complex amplitude A(x') in the image plane is given as $$A(x') = \cdot \int_{-k}^{k} T(x) \cdot \exp(-ikx) dd \quad (3)$$

wherein k is a lateral wave vector component $k=2\pi/\lambda \sin \theta = 2\pi\upsilon$ and where $\upsilon$ is the spatial frequency and wherein coordinates with primes refer to the image space. The maximum angle $\theta_c$ of the wave vector with the optical axis that may pass the optical system is given by the numerical aperture $NA=\sin \theta_c$, so the cut off frequency for a plane wave normally incident on the object, i.e., spatially coherent illumination, is given as $$k_c = NA2\pi/\lambda = 2\pi\upsilon_c.$$

If a one-dimensional grating is now used as an object having a pitch p, so that the $\pm 1^{st}$ and higher diffraction orders do not enter the entrance pupil of the optical system, the diffraction pattern in the pupil is given as a simple integral over the mask transmission function T(x) (eq. (2)). Hence, the intensity to be obtained in the aerial image is determined by the energy of the zero-th diffraction order. If the grating is a regular one, i.e., consisting of equal lines and spaces, T'(k=0)=0.5 and the aerial image intensity is $I(x')=A(x')^2=0.25$. If one defines 1 as being the width of the Cr lines on a conventional quartz/Cr reticle, the parameter $$B = \frac{l}{p} \quad (4)$$

which can be termed as the filling factor of the reticle, describes the percentage of the total reticle area covered by opaque mask features, and determines the image intensity level I'.

$$I' = (1-B) \quad (5)$$

Thus, by adjusting parameter B appropriately, arbitrary image intensity levels can be set, which can subsequently be used to mold a photosensitive resist layer. In standard wafer steppers the reticle is usually illuminated with partially coherent light. If the coherence parameter σ describes the size of the spatial coherence area on the reticle, the limiting spatial frequency passing through the stepper lens is given by $$v_c = (1+\sigma)\frac{NA}{\lambda} \quad (6)$$

Hence the limiting pitch is $$p_c = \frac{1}{1+\sigma}\frac{\lambda}{NA} \quad (7)$$

Thus, if the condition $$p \leq p_c \quad (8)$$

is satisfied, the grating can generally be used to print any desired gray level on the wafer.

However, at this point it becomes clear that the pitch variable can and does cause variations in intensity and it must be noted that the violation of condition (8) will lead to undesired oscillations in the image intensity distribution. In the paper by Wolfgang Henke, et al, the gray level or gray tone mask technique utilizes square or round features which are adjusted in size to vary the intensity based on the spatial frequency filtering method. The problem with this method is that the diffraction, specifically edge diffraction is along a linear edge, the sides of the square aperture and along the outer curve of the circular aperture. This linear diffraction creates dead zones where apertures side by side, interfere, creating intensity variations that cause ultimate feature resolution issues. These issues include waffling, steps or ripples, which are formed into the photo resist that is exposed, leading to undesired optical effects. Because, Wolfgang Henke, et al, does not follow a true gray tone style grid or sub-grid square aperture configuration, this technique is severely limited in the number of gray levels (0 to 255) that can be achieved, effectively reducing the smoothness of transitions between the apertures.

The commonly known method and applications of gray tone or gray scale imaging include various methods of digital halftoning, sometimes referred to as spatial dithering, where halftoning is in general the process by which a continuous-tone, gray-scale image is rendered using only binary-valued pixels and which typically provides or employs 0 to 255 gray scale levels. As is well known and understood, the underlying concept and purpose of digital halftoning is to provide a viewer of an image the illusion of viewing a continuous-tone image when, in fact, only black and white pixel values are used in the rendering. In all cases, these gray level or gray tone algorithms were developed to create an image for viewing by the human eye, and have specific attributes tailored towards this task.

One well known and standard visual image halftone or graytone/level method is dispersed-dot ordered dithering, which occurs when halftone dots, or pixels, are of a fixed size. Clustered-dot ordered dithering, in turn, simulates the variable-sized dots of halftone printing screens in rendering the image. The most noted advantages of ordered dither techniques, however, are speed of implementation and simplicity, while the primary disadvantage is that ordered dithering of all forms produces locally periodic patterns in the halftoned image, which are visually objectionable to the human eye.

Halftoning gray tone/level methods using error diffusion algorithms, as first introduced by Floyd and Steinberg, are currently the most popular halftone image method used in the printing industry. Such methods, however, require neighborhood operations on the image, that is, the sampling of nearby pixels when evaluating each primary pixel. In this algorithm, the error of the quantization process is computed and spatially redistributed within a local neighborhood in an effort to influence pixel quantization decisions within that neighborhood and thereby improve the overall quality of the halftoned image. Once again, this method is primarily designed and adapted for visual impact to the human eye.

The classical approach to error diffusion for the formation of a gray tone/level mask, however, suffers from critical implementation constraints. In this case, the algorithm raster scans the image and, for each individual pixel, a binary quantization decision is made based on the intensity of the individual pixel and the weighted error from pixels within a predefined diffusion region of previously processed pixels. As a result, the diffusion filter is necessarily causal, resulting in undesirable intensity artifacts that will adversely effect the exposure of photo resist if used for gray scale exposure imaging using an optical lithographic technique.

In this regard, one conventional technique for forming a refractive element includes forming structures in photo-resist by patterning and melting a photo-resist layer on a glass substrate, the melting of the photo-resist resulting in the generation of spherical surfaces. An example of this technique is disclosed, for example, in an article by O. Wada, "Ion-Beam Etching of InP and it's Application to the Fabrication of High Radiance InGAsP/InP Light Emitting Diodes", General Electric Chemical Society, Solid State Science and Technology, Vol. 131, No. 10, October, 1984, pp. 2373-2380. However, this technique is limited to special shapes and can only provide spherical contours using a small positive photo resist layer. In addition, the refractive elements are produced by ion milling of the resist structure and the glass substrate wherein the ions first mill the resist and then, once the resist is removed in a certain region, mill the glass substrate, thereby transferring the resist structure to the glass substrate and thereby forming the refractive element.

A varied exposure pattern in a photo-resist can also be generated by directly exposing the photo-resist with a raster-scanned laser or electron beam. However, no mask is created in this method, and each element must be written one at a time, with no benefit of economies of scale. As is well understood, It is desirable to create a gray scale mask that can be reused multiple, for example, thousands, of times to make thousands of wafers.

An exposure mask for fabricating micro-lenses was developed and disclosed, for example, in U.S. Pat. Nos. 5,480,764 and 5,482,800 to Gal et al. and in an article by W. W. Anderson et al. "Fabrication of Micro-optical Devices" Conference on Binary Optics, 1993, pp. 255-269, in an attemp to overcome these limitations. According to the described technique, known as half-toning, the mask is created by constructing a plurality of precisely located and sized openings wherein the frequency and size of these openings produce the desired gray scale effect. However, the apertures of the method as described utilize a grayscale pixelized matrix format wherein the apertures follow a strict square aperture protocol using a pixel grid matrix and a sub-pixel grid matrix. As a consequence, this method leads to photo resist exposure variations that are highly undesirable for precise micro optic applications. In addition, and although this method can be considered halftoning, it is not true digital halftoning, which translates the grid style pixel format of a grayscale map generated by a software package and translates it into a true digital halftone or gray tone/level where an array of fixed sized dots are used to form clusters which relate to the intensity variations desired for the optimum human eye visual effect.

It must also be noted that in addition to the strict fabrication requirements for such masks, the masks are used with a stepper and, for this reason, the pattern of the mask is effectively reduced in size when the resist layer is exposed. This reduction is required because the gray scale resolution elements are binary in value and therefore must be blurred in order to present the desired gray scale effect, so that the gray scale resolution elements no longer appear to be distinct holes. This in turn requires that the mask be a number of times larger than the actual element and the mask will soon become impracticably large when attempting to simultaneously producing many elements. Also, steppers are very expensive equipment.

In addition, and becuase of the required reduction, the point-spread function is larger than the image of the smallest opening in the mask. This blurring allows the mask to form a gray level pattern in the photo resist, but the large size of the point spread function results in a decreased resolution, which is undesirable.

The present invention provides a solution to these and related problems of the prior art.

SUMMARY OF THE INVENTION

The present invention is directed to a gray level imaging mask and to methods for encoding and using such gray level imaging masks and to apparatus for creating and using such masks and, in particular, to the manufacture and use of such masks for use in the manufacturing of micro-mechanical structures, devices and micro-optical components such as diffractive, refractive and holographic (CGH) optics.

The present invention is therefore directed to a grayscale mask for use in imaging operations wherein the mask includes a substrate layer and a mask layer and wherein the mask layer has a plurality of apertatures forming a mask pattern for the transmission of radiation through the mask to form a grayscale image on a workpiece and wherein each edge of each aperture including a plurality segments forming a serrated edge, the segments being dimensioned to result in mixed edge diffraction of the radiation being transmitted through the apertures.

In the presently preferred embodiment, the substrate layer is quartz and the mask layer is chrome.

The apertures may be spaced apart in an irregular and non-symmetric pattern and may be of variable size. The mask may also include a random diffusing layer located on the side of the substrate opposite to the mask layer wherein the random diffusing layer may be of uniform density and wherein the random diffusing layer may be located in proximity to the substrate layer of the mask or may be integral with the substrate layer.

In alternate implementations of the mask, the apertures may be evenly pitched and of variable sizes so that the mask forms a pitched aperture array for the generation of a refractive optical element.

The present invention further includes a method employing a grayscale mask of the present invention for generating an optical element, the method including the steps of generating a desired grayscale pattern on an initial grayscale mask and printing the grayscale pattern of the initial grayscale mask onto a photoresist layer by one of proximity exposure, contact exposure and and optical imaging to generate a photoresist pattern. The method may also include the step of transferring the photoresist pattern onto a transparent layer of a substrate to form an optical element having the grayscale pattern, and the optical element may be a refractive optical element.

In a further implementation of the method of the present invention for generating an optical element the substrate may further include an absorptive layer and at least a part of the photoresist pattern may be transferred into the absorptive layer, and in a further embodiment the substrate further may include a reflective layer and at least a part of the photoresist pattern may again be transferred into the reflective layer.

The substrate may further include an absorptive layer and a reflective layer wherein at least a first part of the photoresist pattern may be transferred into the absorptive layer and at least a second part of the photoresist pattern may be transferred into the reflective layer.

Also, the transferring step may include etching the photoresist pattern into the substrate.

The present invention further includes a method for generating an optical element using a grayscale mask of the present invention, wherein the method includes the steps of generating a desired grayscale pattern in a layer of mask material on an initial grayscale mask wherein the layer of mask material has a variable amplitude transmission in accordance with a desired continuous level phase transmittance function, printing the grayscale pattern of the initial grayscale mask onto a photoresist layer by one of contact exposure or proximity exposure to generate a photoresist pattern, and transferring the photoresist pattern into a selected substrate to form an optical element having the grayscale pattern. The transferring step may include etching the photoresist pattern into the substrate, and may include the steps of generating a master element from the photoresist pattern and injection molding of the substrate with the master element.

The present invention further includes a method for forming a grayscale imaging mask, including the steps of selecting a desired one of a holographic, refractive and diffractive optical element design for formation of the grayscale mask, converting the design to a grayscale pixel image, performing a diffractive intensity averaging process on the pixel image, performing a difractive error diffusion process on the intensity averaged image, converting the average and error diffused image into a binary graytone image, performing a diffractive spatial dithering process on the binary graytone image, generating a coordinate and intensity list describing the mask, and generating a gray level coordinate map of the mask.

The present invention also includes a method for diffractive intensity averaging which includes the steps of generating an intensity plot from an initial grayscale image of the mask, and reiteratively determining a peak intensity in the image, smoothing at least one peak intensity in the image, comparing the intensity smoothed image with the initial grayscale image, and comparing the intensity smoothed image with a preceding intensity smoothed image, until a present degree of intensity smoothing is within selected limits, and finally generating an optimized grayscale image of the intensity smoothed image.

The present invention also includes method for diffractive error diffusion that includes the steps of performing a pixel and pixel neighbor quantification operation on each pixel of an optimized grayscale image, including comparing a binary graytone image generated from the results of the quantification process with the input optimized grayscale image, converting the results of the pixel quantification process into a binary graytone image, performing a diffusion error filtering on the binary graytone image and reiterating the pixel quantification process on the optimized graytone image until the results of the error filtering are within selected limits, and performing diffractive spatial dithering on the resulting binary grayscale image of the mask.

The present invention also includes a method for diffractive spatial dithering that includes the steps of sorting an input graytone image according to coordinates with the image and an intensity of the image at each coordinate, constructing a coordinate data file identifying coordinate points within the image, and, in a parallel step, performing a dithering operation on a pixel at a selected coordinate point and selected surrounding pixels of the coordinate point, constructing an intensity data file containing dithered intensity data for each coordinate point identified in the coordinate data file, and, from the coordinate data file and the intensity data file, constructing a coordinate and intensity data file describing the mask image.

The present invention also includes a method for diffractive intensity averaging in generating a grayscale mask from a grayscale image, including the steps of generating an intensity plot from an initial grayscale image of the mask, and reiteratively determining a peak intensity in the image, smoothing at least one peak intensity in the image, comparing the intensity smoothed image with the initial grayscale image, and comparing the intensity smoothed image with a preceding intensity smoothed image, until a present degree of intensity smoothing is within selected limits, and finally generating an optimized grayscale image of the intensity smoothed image.

The present invention further includes a method for diffractive error diffusion for use in generating a grayscale mask from a grayscale image, including the steps of receiving an input optimized grayscale image of the mask, performing a pixel and pixel neighbor quantification operation on each pixel of the optimized grayscale image, including comparing a binary graytone image generated from the results of the quantification process with the input optimized grayscale image, converting the results of the pixel quantification process into a binary graytone image, performing a diffusion error filtering on the binary graytone image and reiterating the pixel quantification process on the optimized graytone image until the results of the error filtering are within selected limits, and performing diffractive spatial dithering on the resulting binary grayscale image of the mask.

The present invention also includes a method for diffractive spatial dithering in generating a grayscale mask from a grayscale image, including the steps of sorting an input graytone image according to coordinates within the image and an intensity of the image at each coordinate, constructing a coordinate data file identifying coordinate points within the grayscale image, and, in a parallel step, performing a dithering operation on a pixel at a selected coordinate point and selected surrounding pixels of the coordinate point, constructing an intensity data file containing dithered intensity data for each coordinate point identified in the coordinate data file, and, from the coordinate data file and the intensity data file, constructing a coordinate and intensity data file describing the mask image.

Other aspects of the present invention will be seen from study of the following description of embodiments of the present invention, including the Figures in which:

DESCRIPTION OF THE PREFERRED EMBODIMENTS

Figure 1A:
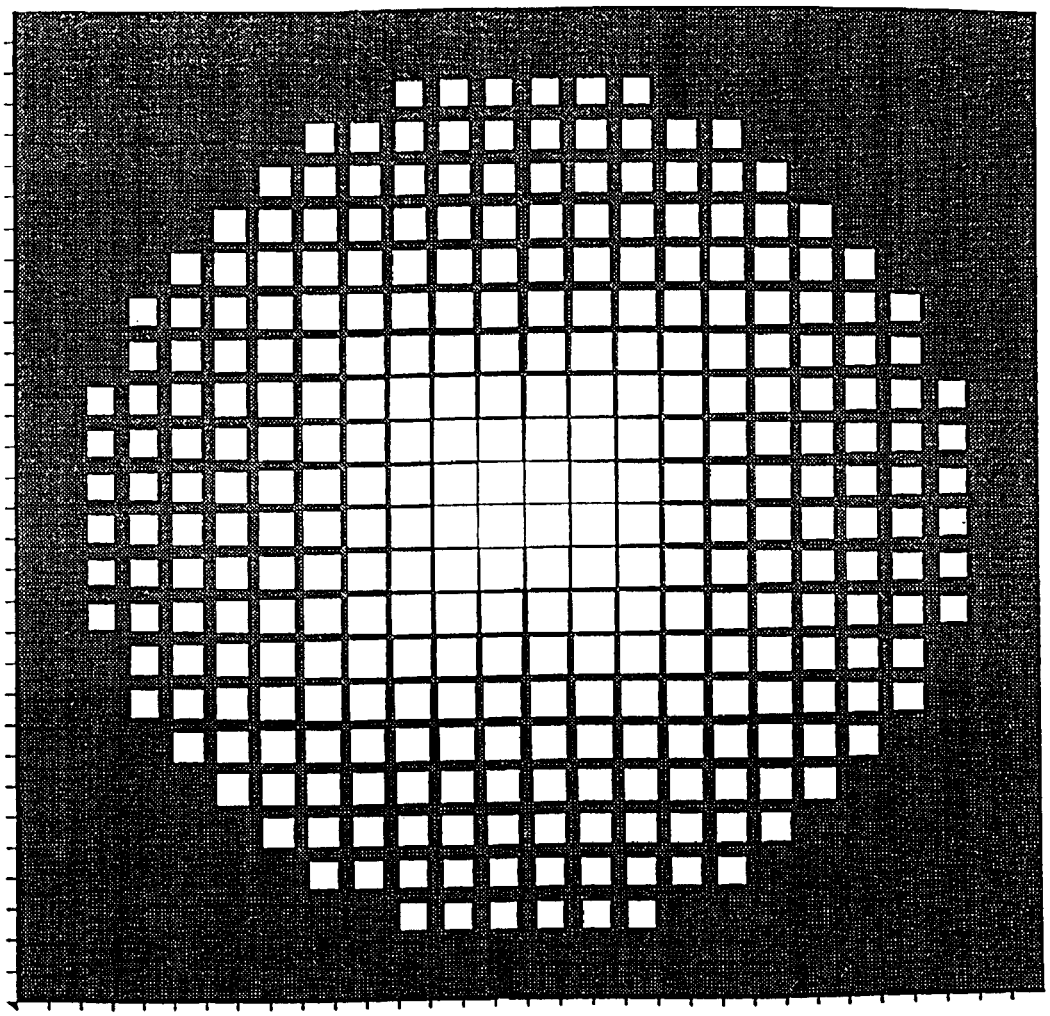
FIGS. 1A through 1E are respectively illustrations of a graytone hemispherical intensity distribution mask of the prior art, a fixed pitch graytone mask of the prior art, of pattern placement on a fixed pitch graytone mask of the prior art, of a fixed dot/fixed pitch digital halftone mask of the prior art, and of a fixed square pixel/fixed pitch grid and sub-grid based halftone mask of the prior art.
Figure 1B:
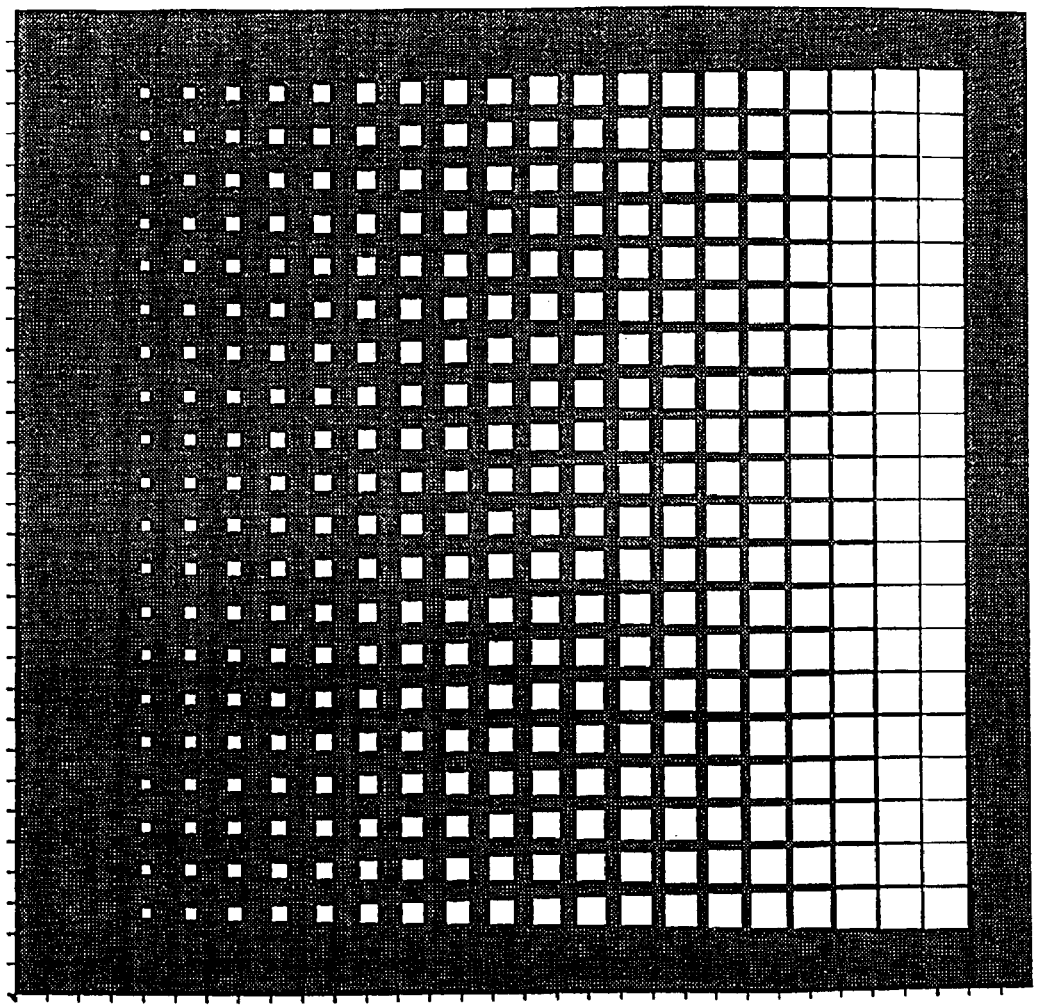
Figure 1C:
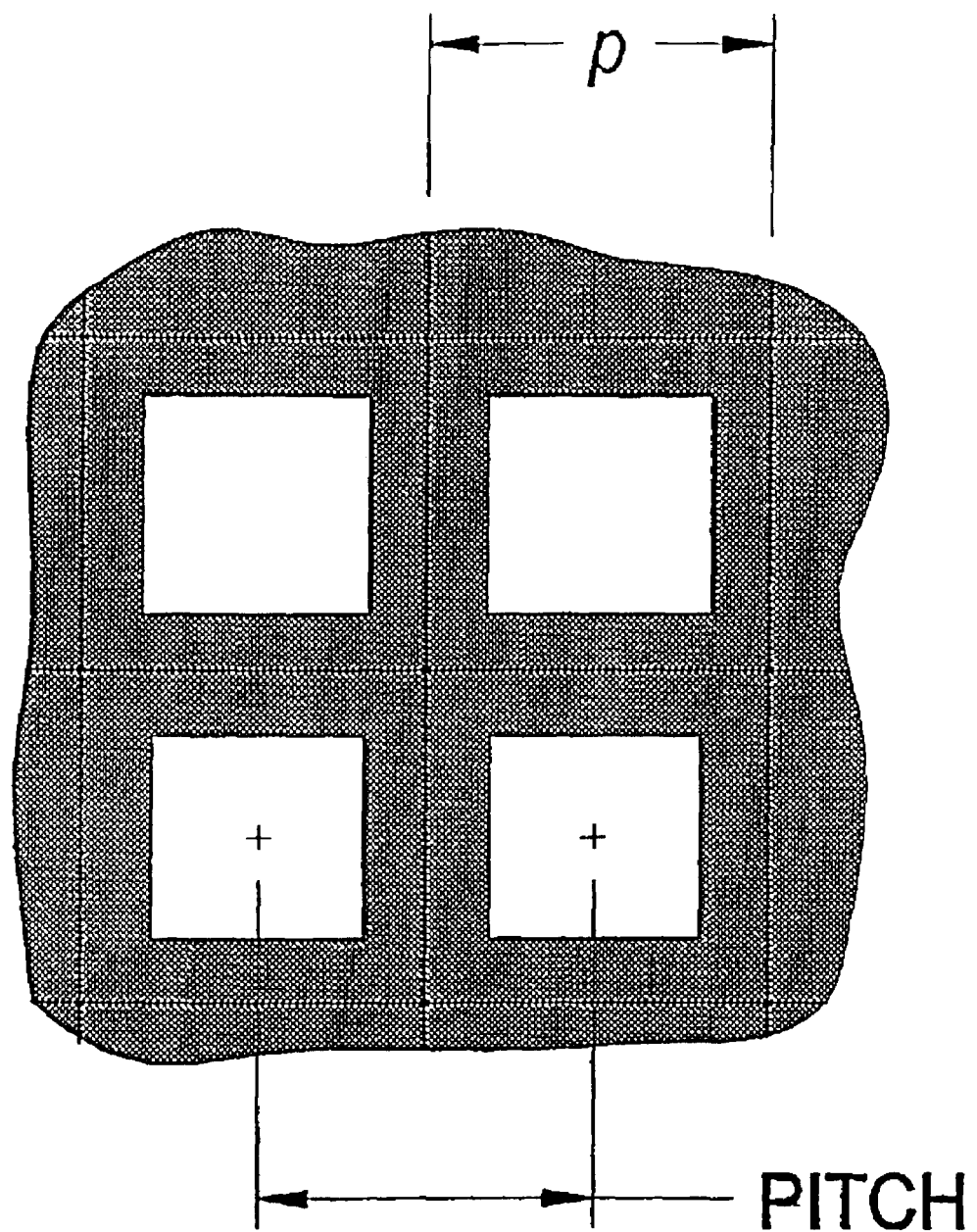
Figure 1D:
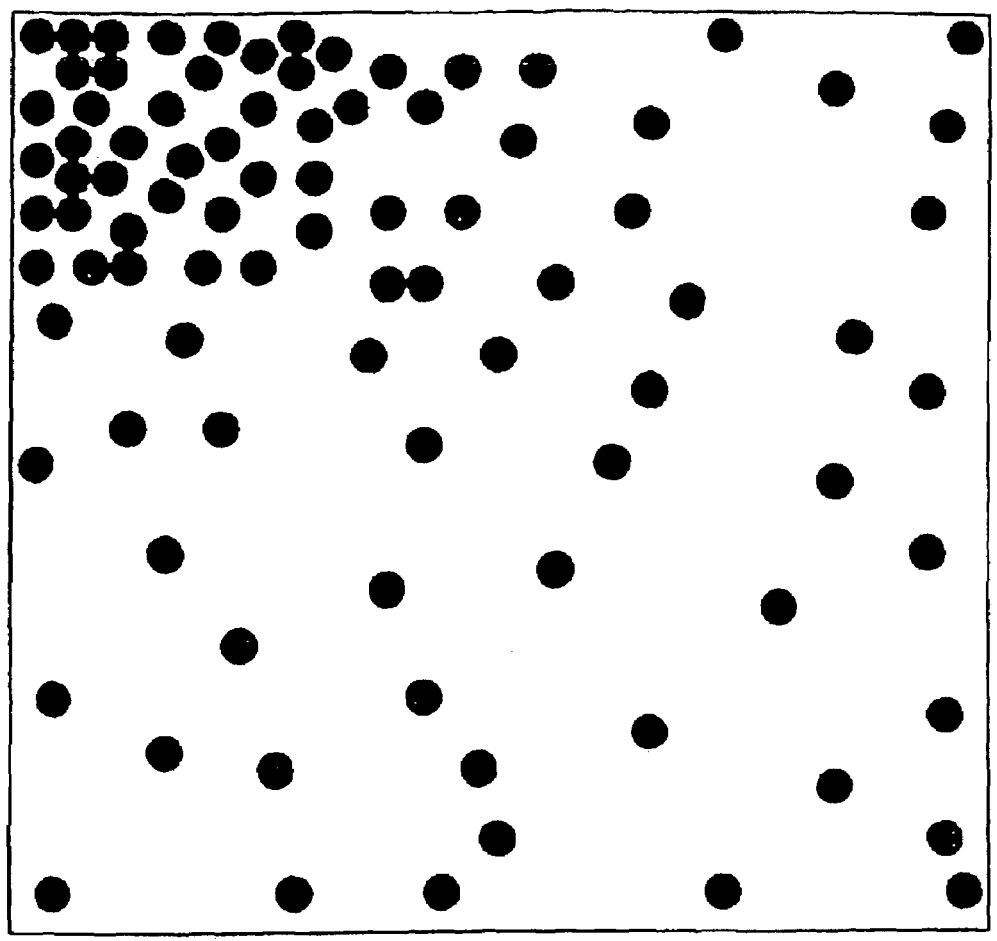
Figure 1E:
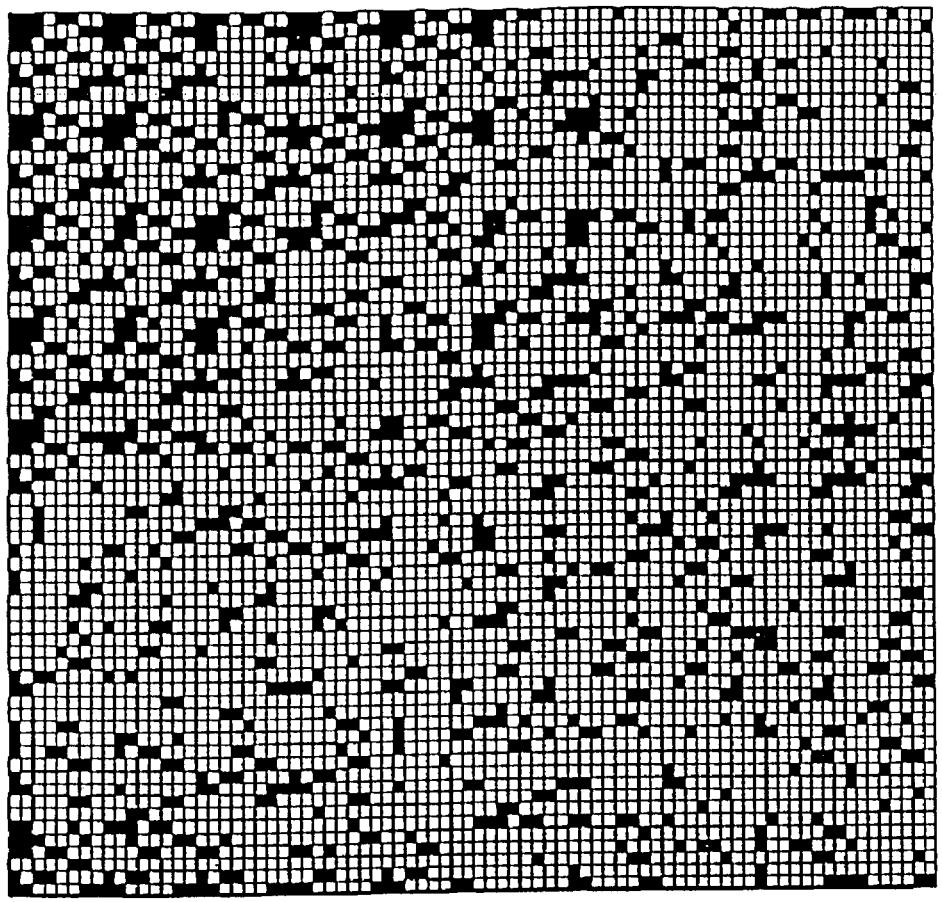

As described herein above, the problems of the prior art in encoding, making and using imaging masks in micro-imaging and micro-machining using optical imaging lithography processes is the generation of steps, ripples or other unwanted patterns in the intensity of radiation delivered to a sub-strate which is to be directly etched by the radiation or which is, for example, a photo-resist layer to be exposed by the radiation. As described, such unwanted variations in the radiation intensity delivered to the substrate are commonly the result of diffration effects through the gray scale mask used to form the pattern of radiation arriving on the sub-strate and, in particular, are most commonly the result of edge diffraction effects arising from the pattern edges in the gray scale The methods of optical imaging lithography using gray scale masks of the prior art have been discussed herein above and are illustrated in FIGS. 1A through 1E wherein FIGS. 1A, 1B and 1C are illustrations of a graytone hemispherical intensity distribution mask of the prior art, a fixed pitch graytone mask of the prior art, and of pattern placement on a fixed pitch graytone mask of the prior art. FIGS. 1D and 1E, in turn, are illustrations of a fixed dot/fixed pitch digital halftone mask of the prior art and of a fixed square pixel/fixed pitch grid and sub-grid based halftone mask of the prior art.

According to the present invention, the steps, ripples or other unwanted patterns or variations in the intensity of radiation delivered to a sub-strate in optical lithographic methods of the prior art are significantly reduced or eliminated by providing the greatest number of gray scale levels through the mask and by designing the mask, the apertures therein and the edges of the apertures therein to diffuse, fragment or cause cross cancellation among the edge diffraction effects or, in alternate or further embodiments, to include diffusion layers in the mask to similarly diffuse the edge diffraction patterns.

Figure 2:
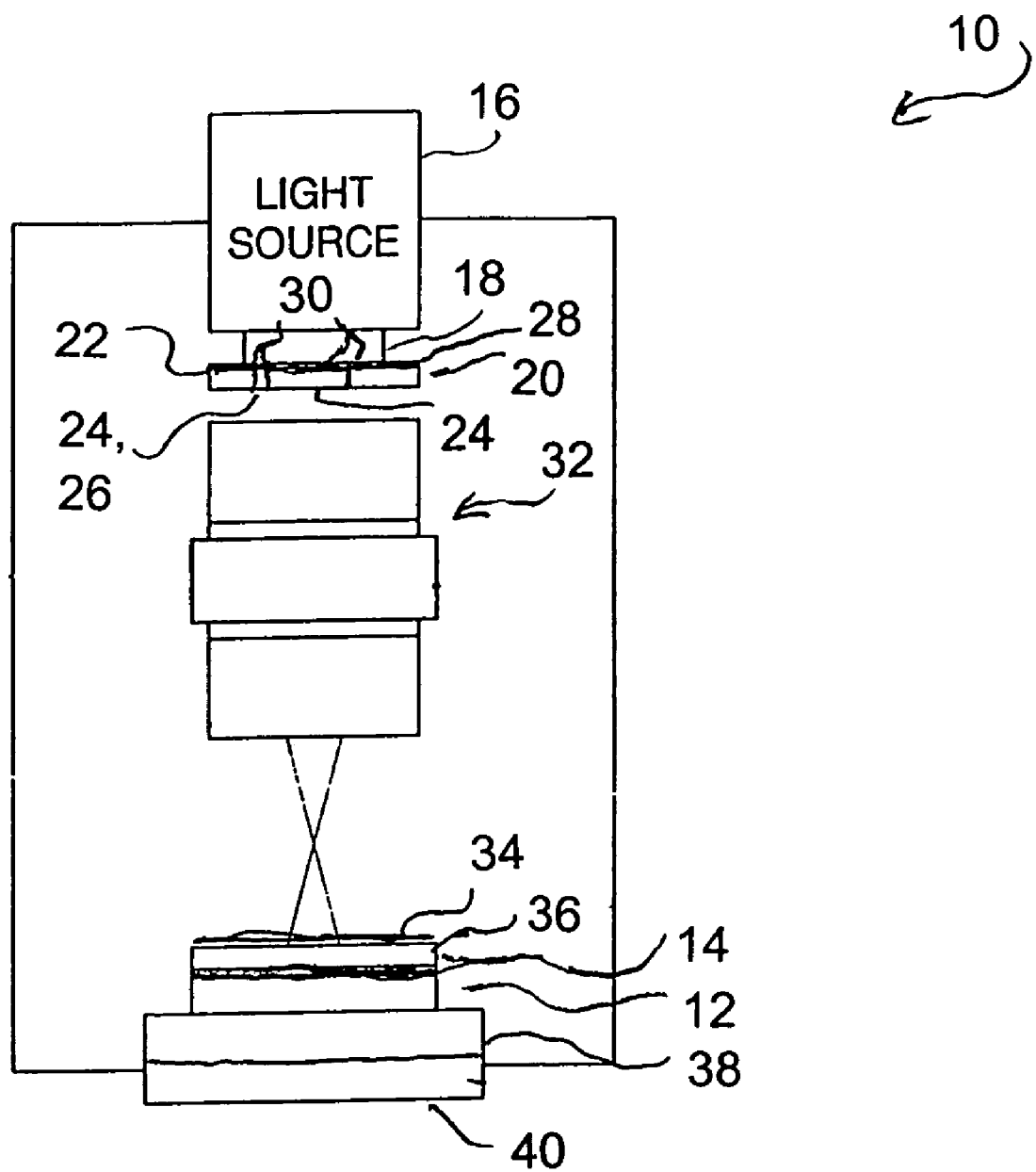
FIG. 2 is an illustration of the prior art and the present invention with respect to edge diffraction versus mixed edge diffration for masks of the prior art and a mask according to one embodiment of the present invention.

First considering the general processes and apparatus for optical lithographic gray level imaging, Graytone Emaging System 10 is illustrated in FIG. 2 and may be used, for example, for direct etching of a Substrate 12 or for exposure of a Photoresist Layer 14 on the Substrate 12. As shown, the System 10 includes a Radiation Source 16, such as an infra-red laser or other suitable source of radiation or light, which projects Radiation 18 through a Gray Scale Mask 20. The Gray Scale Mask 20, in turn, is comprised of a Mask Substrate 22, such as a quartz material, wherein Mask Substrate 22 has Mask Apertures 24 therethrough which form the Mask Pattern 26 of Radiation 16 directed onto Substrate 12.

As well known in the art, Mask Apertures 24 may be formed in a number of ways, depdending upon the properties of Mask Substrate 22 and Radiation 16. For example, Mask Apertures 24 may be formed of physical aperture or openings through Mask Substrate 22. In other embodiments, Mask Substrate 22 maybe coated with a Mask Layer 28 comprised of material that is opaque to Radiation 16 and Mask Apertures 24 may be areas in which the Mask Layer 28 has been removed or has been made transparent to the Radiation 16, thereby providing Radiation 16 apertures through the Gray Scale Mask 20 rather than physical openings. As will be well understood, Mask Apertures 24 will have Mask Edges 30, which may result in the edge diffraction effects discussed herein above.

Finally, the pattern of Radiation 16 formed by Gray Scale Mask 20 will be projected through an Imaging Lens 32 and onto a surface of Substrate 12 or Photoresist Layer 14 as an Image 34 on Image Plane 36. Other elements of a System 10 may include a Workpiece Holder and Stages 38 for holding and positioning Substrate 12, and a Stepper 40 for positioning the Workpiece Holder and Stages 38.

Figure 3:
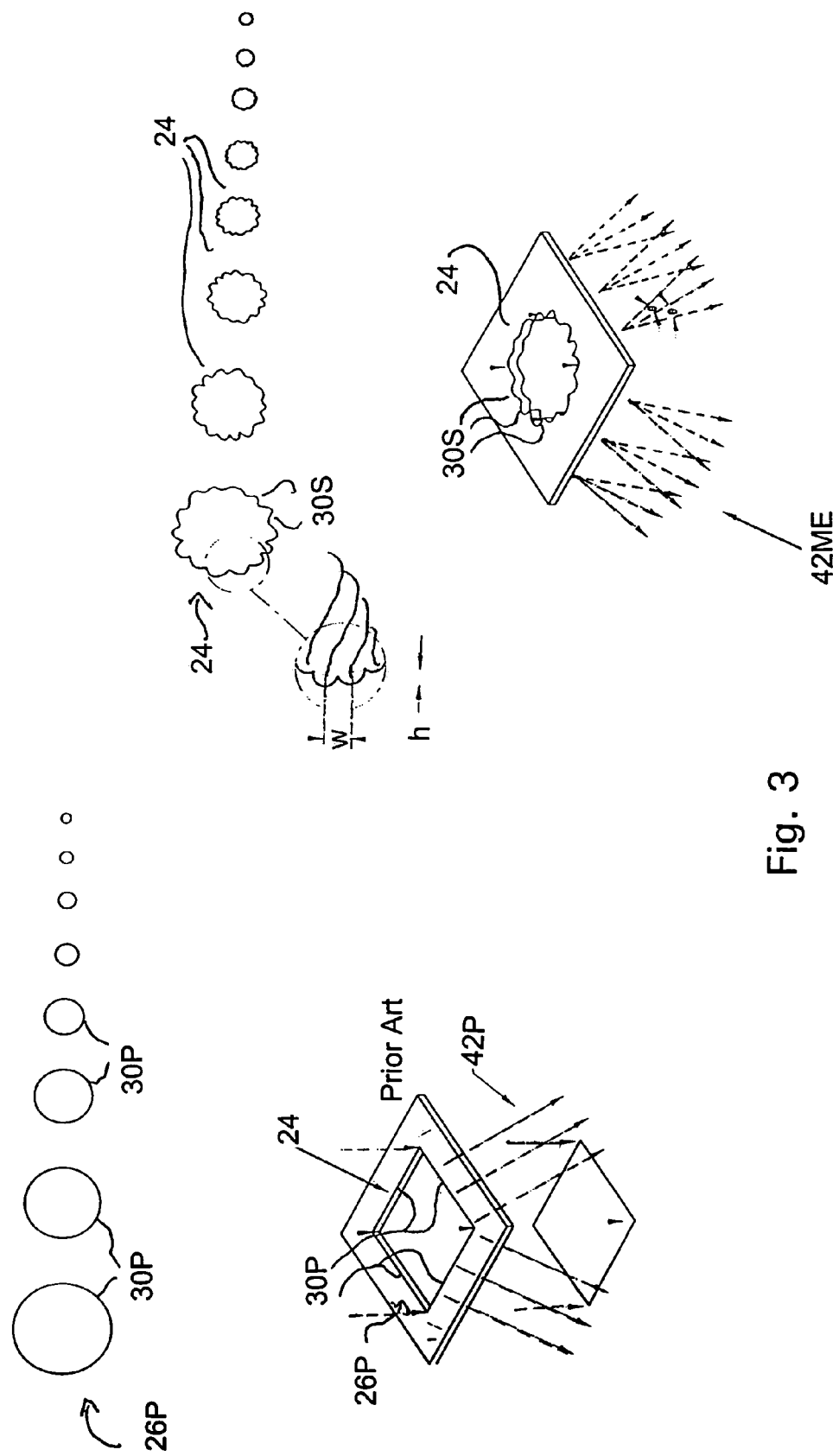
FIG. 3 is an illustration of a graytone mask providing mixed edge diffraction.
Figure 6A:
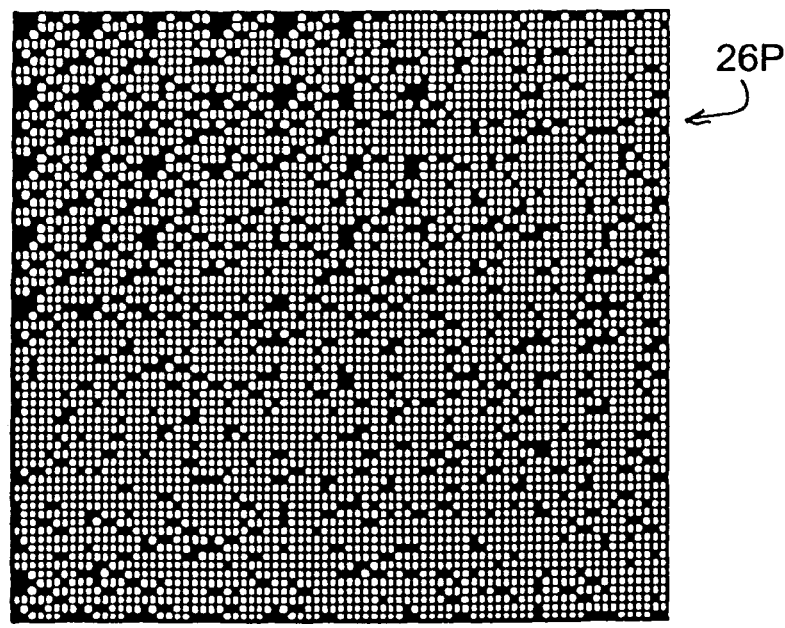
FIGS. 6A through 6D are comparison illustrations of graytone masks providing mixed edge diffraction and masks of the prior art providing linear edge diffraction.
Figure 6B:
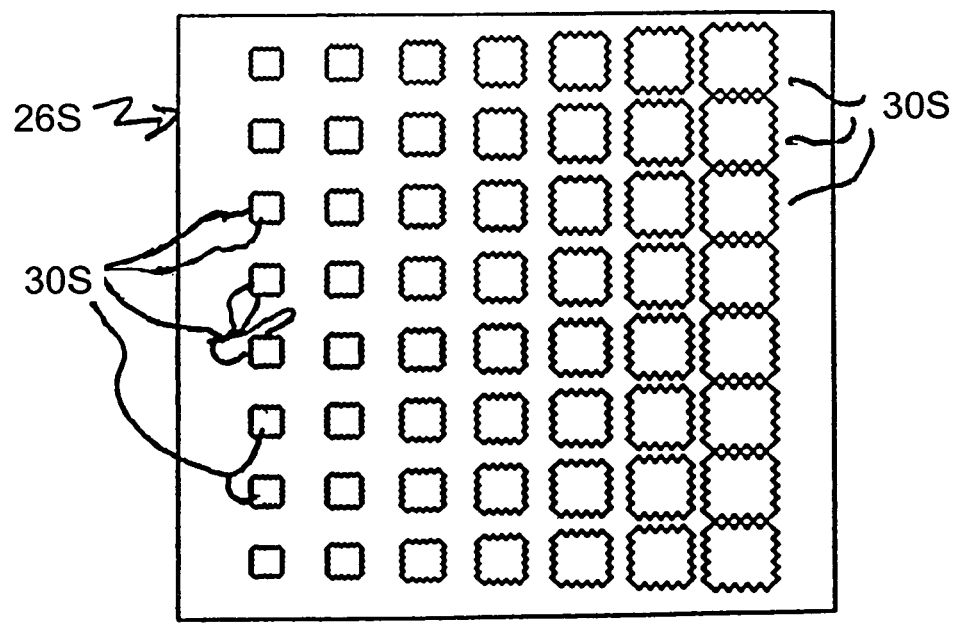

A first embodiment of the present invention is illustrated in FIGS. 3, 6A and 6B which illustrate the linear edge diffraction occuring with masks and mask patterns of the prior art with mixed edge diffraction generated by a Gray Scale Mask 20 and Mask Pattern 26 of the present invention. As shown in these Figures, a Mask Pattern 26P of the prior art is comprised of Mask Apertures 24P wherein the Mask Apertures 24P are regularly spaced across the Mask Pattern 26P and are of uniform size and shape with straight or otherwise regular Edges 30, such as the smooth edges of circular Apertures 24P. The result of such a Mask Pattern 26P will be Linear Edge Diffraction 42P wherein the diffraction pattern from each Edge 30P will be clearly apparent and of an extent determined by the size of the Edge 30P, as discussed herein above. It must also be noted that the diffraction patterns of multiple Edges 30P, whether of one Aperture 24P or of multiple Apertures 34P, may combine to form new diffraction patterns or to reinforce one another.

According to the present invention as illustrated in FIGS. 3 and 6B, a Serrated Mask Pattern 26S of a Serrated Mask 20S of the present invention will be generated by digital halftoning or gray tone/level algorithms so as to be comprised of a specific distribution pattern of Serrated Mask Apertures 24S wherein the Mask Edge 30 of each Serrated Mask Aperture 24 is a Serrated Edge 30S comprised of Segments 44 wherein Segments 44 are sized and positioned relative to one another to form what may be generally described as a jagged, scalloped or serrated edge. The extents, relative location and orientation of the diffraction pattern formed by the edge of each Segment 44 will be determined by the length, orientation, shape and relative location of each Segment 44. According to the present invention, therefore, the dimensions and relative positions and orientations of Segments 44 are selected such that the diffraction patterns formed by each of the Serrated Edges 30S will be effectively diffused with respect to one another by their comparative reduction in extent, their orientations and their relative locations. In particular, the diffraction patterns of Segments 44 will generally not reinforce one another and will generally not combine to form a large diffration pattern and may even cancel one other over at least certain areas. The effective diffusion of the diffraction patterns generated by Serrated Edges 30S will thereby result in what is termed herein "mixed diffraction lines" and will result in more effective gray scale levels or tones. As illustrated in FIG. 3, Mixed Edge Diffraction 42ME, will be an increased level of radiation mixing or diffusion between the edges of Serrated Mask Apertures 24S, thereby providing effectively increased resolution of the Image 34 and minimizing unwanted intensity variations within the Image 34.

Figure 4A:
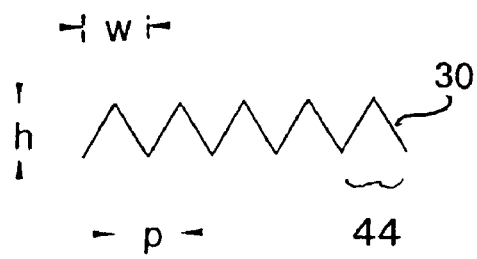
FIGS. 4A through 4E are illustrations of possible embodiments of serrated edges for mask apertures.
Figure 4B:
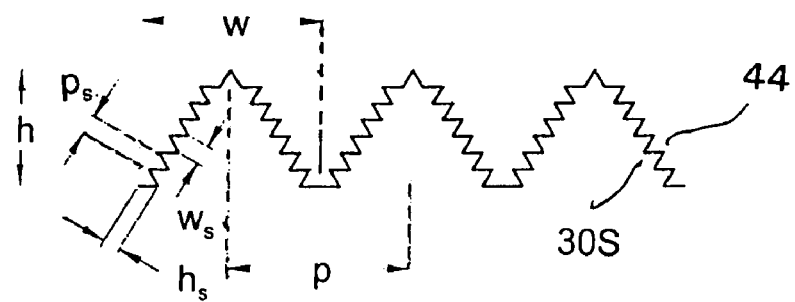
Figure 4C:
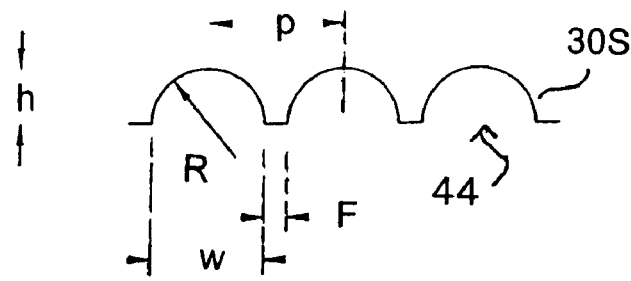
Figure 4D:
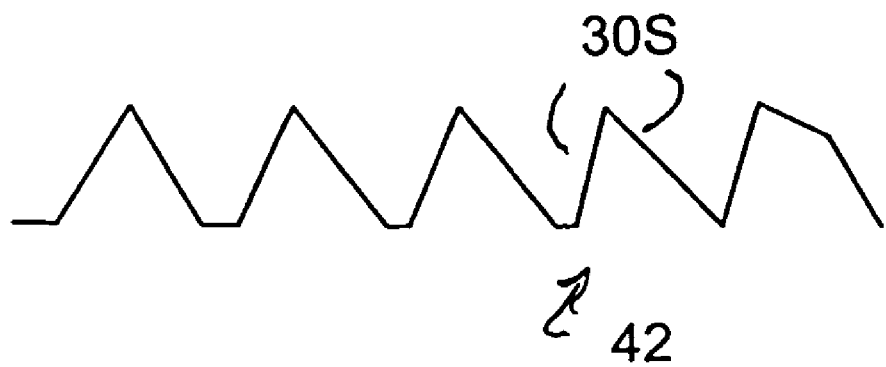
Figure 4E:
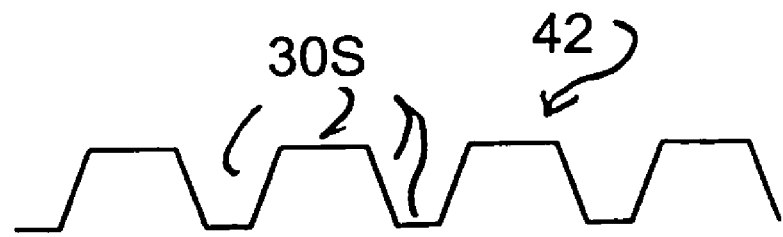

Possible variations and alternate embodiments of Serrated Mask Edges 30S are illustrated in FIGS. 4A through 4A through 4D.

Further embodiments of the above described Mask 20 for reducing edge diffraction effects by mixed edge diffraction are illustrated with reference to FIGS. 5 and 6C and 6D as a Diffractive Error Diffusion Mask 20DED. A Diffractive Error Diffusion Mask 20DED again provides an increased number of gray scale levels and reduce edge diffraction effects through a mask which causes diffusion, fragmentation or cause cross cancellation among the edge diffraction patterns.

Figure 5:
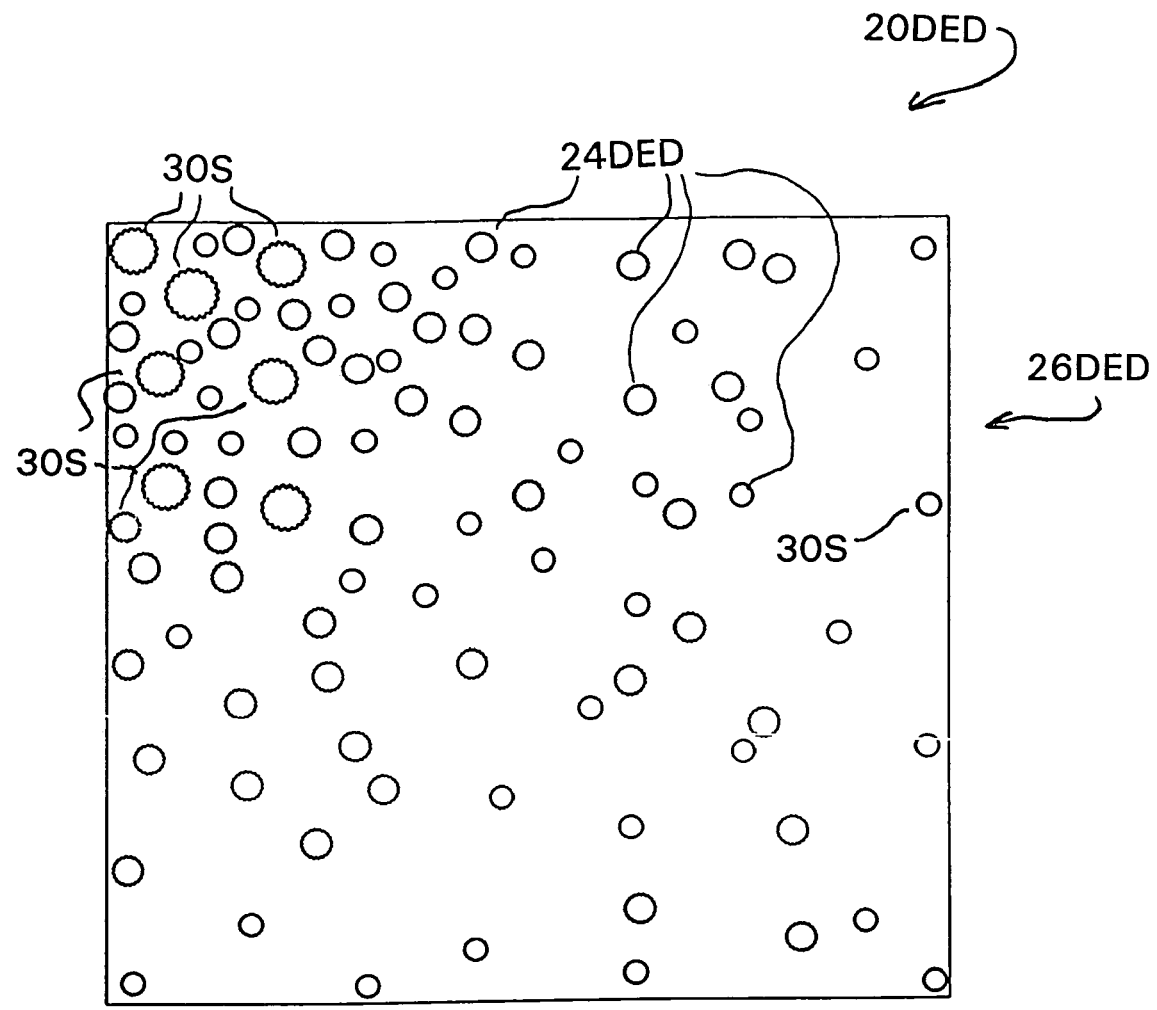
FIG. 5 is an illustration of a diffractive error diffusion mask with variable aperture pitch, variable aperture size and serrated aperture edges.
Figure 6C:
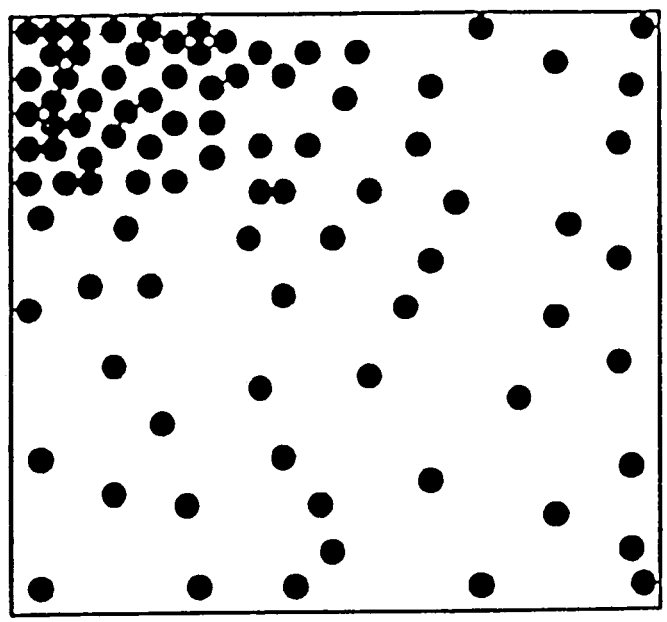
Figure 6D:
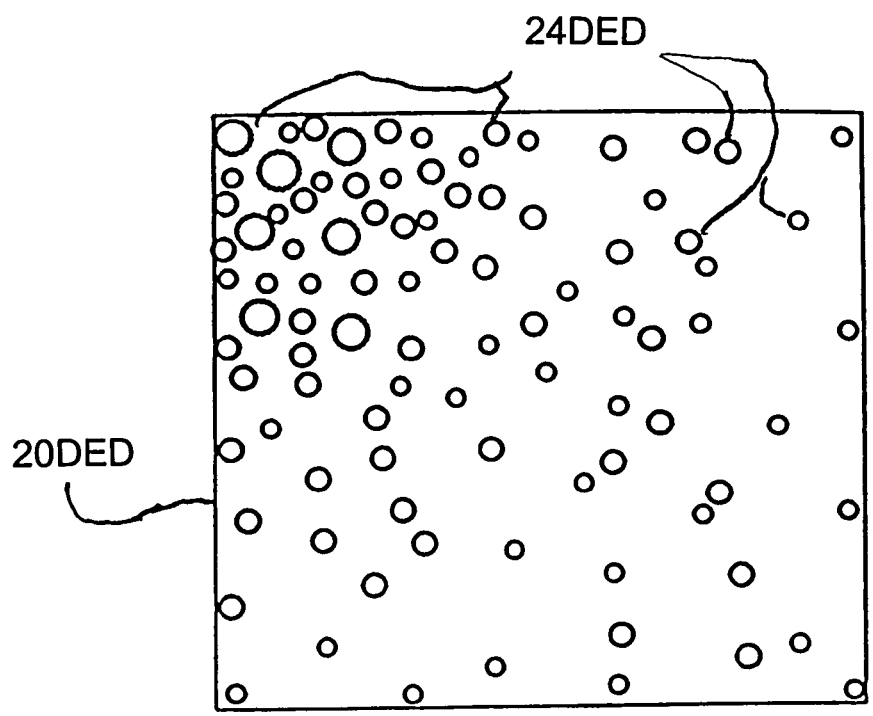

According to this embodiment of the invention, and as generally illustrated in FIGS. 5 and 6D, a Diffuse Error Mask 20DED is comprised of Diffuse Error Mask Apertures 24DED that are distributed across the Diffuse Error Mask 20DED in an irregular or non-symmetric pattern and that may be of different sizes and shapes and that may have Serrated Edges 30S as described above. The pattern of distribution, sizes, shapes and edges of the Diffuse Error Mask Apertures 24DED are determined according to the desired gray tone image and according to the spatial filtering effects of the system, but so as to reduce the number and magnitude of visual artifacts resulting from edge diffraction through the Apertures 24. A Diffuse Error Mask 20DED of the present invention thereby functions in a manner analogous to a Serrated Mask 20S, but employs variations in the pattern and sizes of the Apertures 24 instead or or in addition to Serrated Edges 30S to cause diffusion, fragmentation or cause cross cancellation among the edge diffraction patterns the Apertures 24.

In this regard, it should be noted that a Diffuse Error Mask 20DED of the present invention is in fundamental contrast from conventional gray tone or half tone masks, which use a regular pattern of apertures of uniform size and shape in order to obtain an effect and appearance that is appealing and comfortable to human vision.

Lastly with regard to the Serrated Mask 20S and Diffuse Error Mask 20DED discussed above, it must be noted that either mask may be implemented and employed as a pitched aperture array on a standard chrome on quartz mask to generate a refractive optic element in an imaging system employing a stepper, such as Stepper 40 of FIG. 2. In this embodiment, the apertures in the mask will evenly pitched, to operate with a stepper positioner, but the apertures in the mask may vary in size and will include the serrated, scalloped or jagged edges described above. The element will thereby provide a diffractive scrambling effect that will in turn provide enhanced intensity smoothing between the apertures when imaged onto a photoresist layer through an optical imaging system such as illustrated in FIG. 2.

Figure 7:
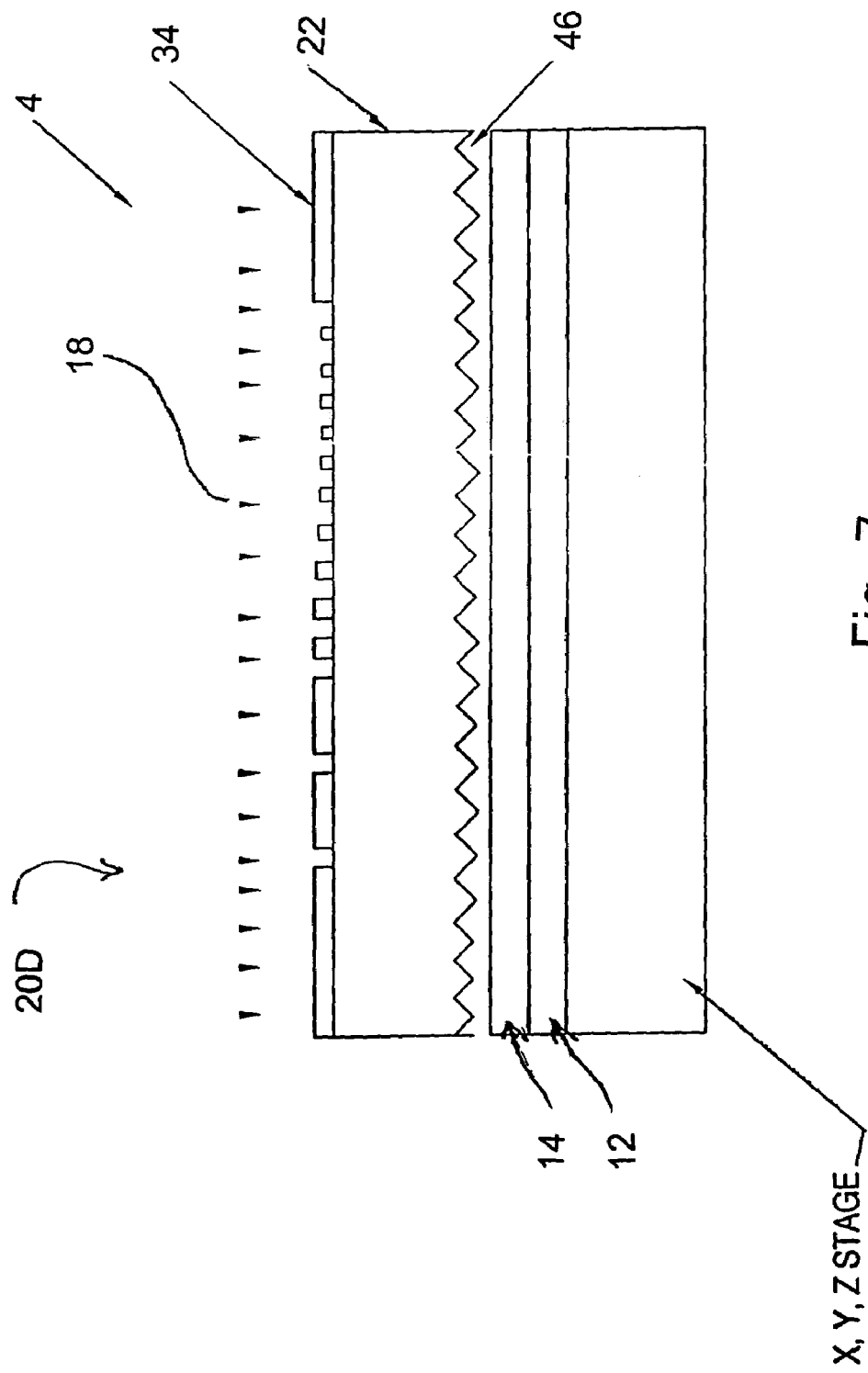
FIG. 7 is an illustration of a graytone mask with diffusing element.

Referring now to FIG. 7, therein is illustrated yet another implementation of the present invention wherein a diffractive digital halftoned Image 34 is formed into a conventional chrome on quartz Mask 20D, which incorporates a Random Diffusing Element 46 with uniform density on the opposite side of the Mask Substrate 22 from the Mask 20D. According to the present invention, Mask 20D may be a conventional Mask 20P or may preferably be a Serrated Mask 20S or Diffuse Error Mask 20DED, as described above, and Random Diffusing Element 46 may be directly attached to Mask 20D or may be mounted in proximity to Mask 20D. The function of Random Diffusing Element 46 is to "scramble" the illuminating Radiation 18 passing through Mask 20D, thereby diffusing linear edge diffraction effects when employed with a convetional Mask 20P or further assisting in diffusing remaining mixed edge diffraction effects when employed with, for example, a Serrated Mask 20S or Diffuse Error Mask 20DED.

Figure 8:
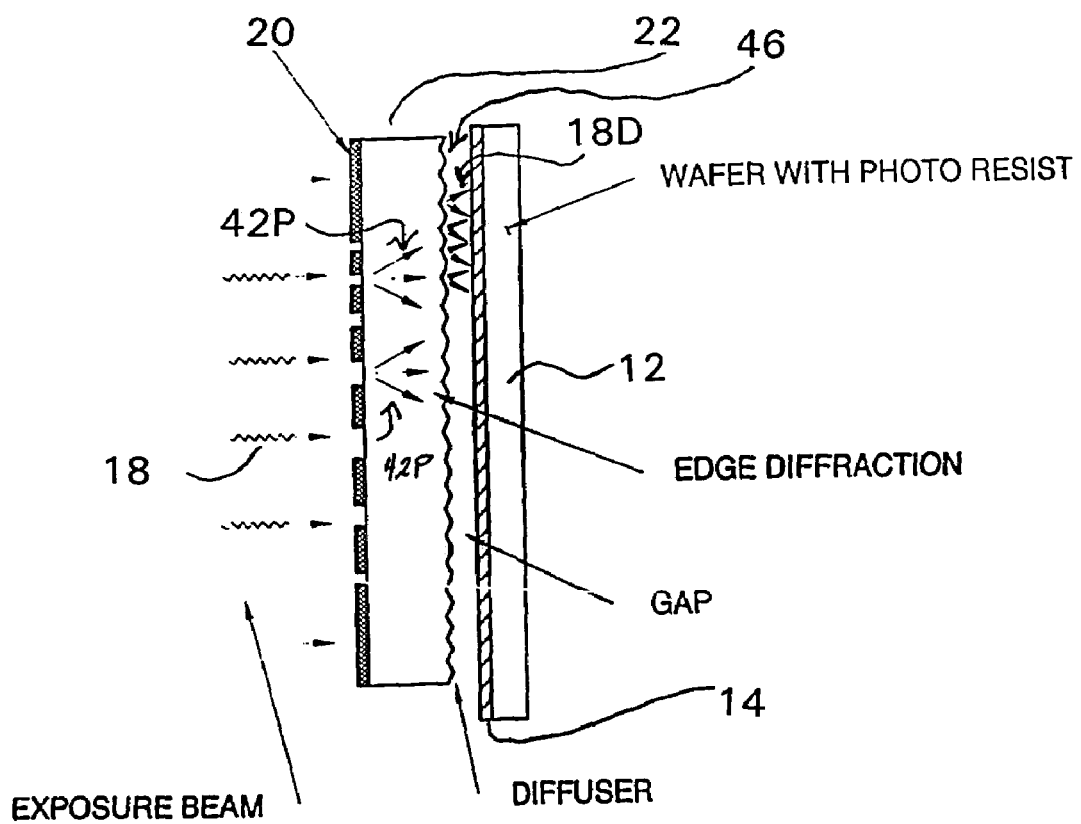
FIG. 8 is an illustration of the diffusion of linear or mixed edge diffraction effects by a diffusion element integral with a mask.

The operation of the Random Diffusing Element 46 is further illustrated in FIG. 8 for an imaging system employing proximity exposure of a Photoresist Layer 14 on a Substrate 12 wherein, in this illustrated embodiment, the Random Diffusing Element 46 is integrated with a gray level Mask 20. As indicated, Radiation 18 directed onto and through the Mask 20 may be subjected to Linear Edge Diffraction 42P, as has been discussed herein above, or may be subjected to Mixed Edge Diffraction 42ME if a Serrated Mask 20S or Diffuse Error Mask 20DED is employed as the Mask 20. In either case, however, the Random Diffusing Element 46 will randomly diffuse the Radiation reaching the Random Diffusing Element 46 after passing through the Mask 20, thereby reducing the effects of either the Linear Edge Diffraction 42P or the Mixed Edge Diffraction 42ME.

It must also be noted that the combination of a Mask 20D and Random Diffusing Element 46 may also be employed with an optical imaging system, such as a stepper system described above, or in systems employing proximity or contact exposure of a Photoresist Layer 14.

Next, it must be noted that the above described masks employing serrated edges for the radiation transmission openings or paths in the mask or employing such serrated edges with openings that are irregularly, randomly or non-symmetrically located or are of differing sizes or shapes, or any combination thereof, may be implemented or embodied in masks other than radiation transmission/non-transmission masks, that is, masks wherein the impinging radiation is either passed through or is not passed through depending upon the pattern of "openings" in the mask.

Figure 9:
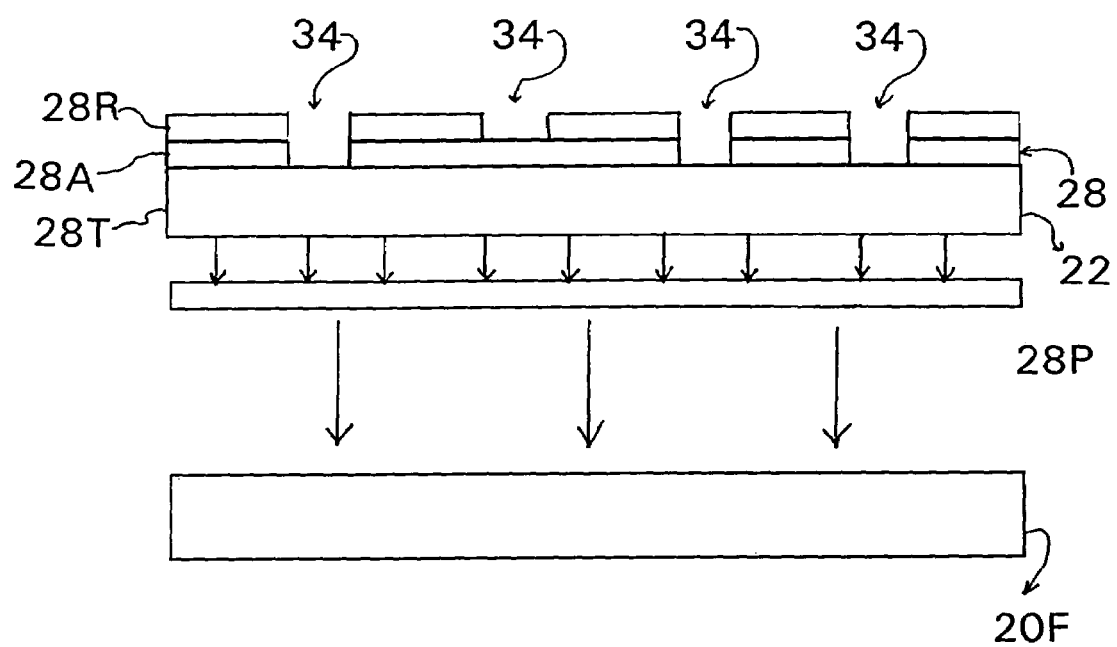
FIG. 9 is an illustration of a mask having reflective and translucent zones made of apertures in a conventional chrome on quartz mask.

Examples of further embodiments of the present invention are illustrated in FIG. 9, which shows an initial grayscale Mask 22 having a grayscale pattern 26 and having, for example, a Translucent or Transparent Layer 28T, which may be comprised of the Substrate 22, and one or both of a Reflective Layer 28R and an Absorptive Layer 28A. The transmittivity of Apertures 34 will then be dependent upon the Mask Pattern 26 as expressed in each of Layers 28, so that some areas of the Mask 20 may be reflective, other areas absorptive and other areas translucent or transparent. As described below, the initial Mask 20 may be used to create a photosensitive or photoresistant Layer or Mask 28P, which may then be used to generate a final Mask 20F or other desired optical element.

For example, an optimized diffractive digital halftone image on chrome Mask Layer 28 on a quartz Mask Substrate 22 may be used to form a second, gray scale Mask 20 by exposing a Mask Layer 28 formed of a photo-sensitive material on a Mask Substrate 22 wherein the photo-sensitive material is a material that is absorptive with respect to the Radiation 18 with which it will be used. In this embodiment, therefore, the gray scale Mask 20 will absorb rather than reflect Radiation in those areas not comprising the Mask Pattern 26; that is, the Radiation 18 will pass through the Apertures 24 forming the Mask Pattern 26 and will be absorbed in the remaining areas of the Mask 20.

In a further embodiment of the above, a true gray scale Mask 20 may be comprised of reflective and translucent areas corresponding to the desired gray scale Mask Pattern 26 wherein the apertures in the Mask 20 are comprised of Serrated Apertures 24S in a standard chrome on quartz Mask 20, the apertures thereby allowing enhanced edge diffractions as Radiation 18 passes through the Serrated Apertures 24S, and wherein the apertures are distributed in a halftone pattern using an error diffusion algorithm described in the following discussions. The Mask Pattern 26 generated by the error diffusion algorithm distributes the Apertures 24 and Mask Layer 28 material in the chrome Mask layer 28 material according to the specific intensity variation required to achieve the desired uniform gray scale, gray tone or gray level intensity distribution. The Mask Pattern 26 of this true gray scale Mask 20 may then be transferred to a photoresistive material using contact, optical or proximity printing, and the photoresist pattern may then be used to transfer the pattern to create the desired optical element.

In yet another embodiment of the invention, a gray scale Mask 20 may be created by generating the gray tone or gray scale Mask 20 in a photosensitive material, using an optimized digital halftone generator as described below and which generates a pattern using Serrated Apertures 34S, thereby providing a Mask 20 having an increased number of gray scale levels. The method may also be implemented using a single gray tone or gray level Mask 20 wherein the Mask 20 is used to form an image of the gray tone or gray scale Mask 20 onto a photosensitive material. The pattern formed in the photosensitive material is then transferred to an absorptive material, as discussed herein above, thereby creating a Mask 20 having more than two levels, or Layers 28, in the Mask 20, and wherein the thickness of the layers may be unevenly spaced, depending upon the materials used.

The above described processes may be used to generate any desired refractive optical element including a desired gray scale Pattern 26 on a Mask 20 by positioning the Mask 20 in proximity with a photo-resistive material without any intervening projection elements, exposing the photo-resistive material through the Mask 20, and transferring the Pattern 26 of the photo-resistive material into a transparent material to form the desired refractive element. The process may include creating a Layer 28 of absorption material having variable thickness, including placing a Layer 28 of a partially absorbing material on a transmissive Substrate 12 and patterning and etching the layer or layers of material with multiple binary Masks 20. In this regard, it will be noted that a true gray scale Mask 20 is not required in proximity printing, and that any of the above described Masks 20 may be used in this process.

It must also be noted that the above processes may be implemented using a starting Mask 20 having a Layer 28 of mask material having a variable amplitude of transmission in accordance with a desired continuous level phase transmittance function and placing the starting Mask 20 in direct contact with or in proximity with a photo-resist on a substrate, exposing the photo-resist through the mask, thereby forming the optical element in the photo-resist, and transferring the photo-resist into a selected substrate thereby forming the desired optical element.

It should also be noted that the transferring step may include directly exposing the resistive material with laser beam or electron beam lithography. The patterning or etching step may include placing a photo-resistive layer on the transmissive substate, thereby creating a gray scale pattern in the resistive material, and transferring the gray scale pattern to the partically absorbing material. The transfer step may also include the making of a master element from the photo-resist and injection molding the desired substrate with the master element.

Next referring to FIGS. 10 through 14, therein are illustrated certain processes and methods employed in or with the present invention and the masks of the present invention. It will be noted that each step in each process or method is indicated by a numeral accompanied by a letter, both enclosed in parenthesis, such as (100B) or (140D). The numeral is the figure number of the figure in which the process or method is illustrated, with the addition of a 0 in the rightmost position to avoid possible confusion with element numbers used in previous discussions, and the letter indicates the particular step of the process or method being described.

Figure 10:
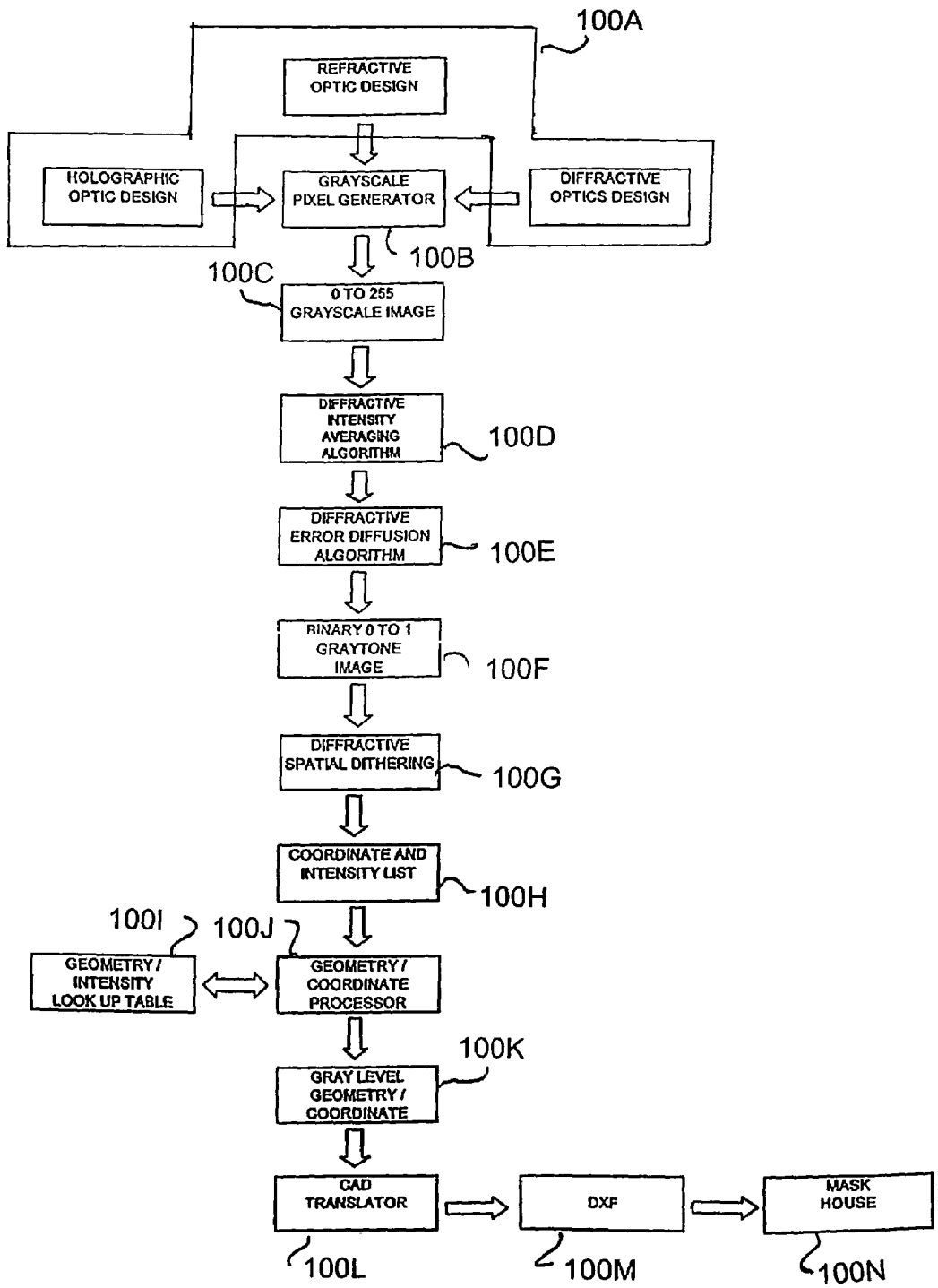
FIG. 10 is a flow diagram illustrating a method for forming a gray level mask artwork and the corresponding mask of the present invention.

FIG. 10 is a flow diagram illustrating a method for forming a gray level mask artwork and the corresponding mask of the present invention. As illustrated therein, the process begins at Step 100A with the choice of a desired holographic, refractive or diffractive optical element design. In Steps 100B and 100C the design is converted to a pixel image and to a grayscale image. In Steps 100D the grayscale image is subjected to diffractive intensity averaging process and in Step 100E the intensity averaged image is subjected to a difractive error diffusion process to generate information describing the basic image in terms of the masks of the present invention. In Step 100F the processed image is converted into a binary graytone image and, in Step 100G, is subjected to diffractive spatial dithering. Then in Step 100H a coordinate and intensity list is generated, which is essentially a map of the mask and the image intensity at each location therein, and in Steps 100I and 100J an intensity lookup table and a coordinate processor are employed to generate, in Step 100K, a gray level coordinate map of the mask. The mask may then be processed through a CAD translator in Step 100L to obtain, in Step 100M, a CAD readable file, which may then be sent in Step 100N to a mask maker.

In summary, therefore, the method illustrated in FIG. 10 scans a given gray scale image, balances the brightest intensities and diffuses the quantization error in a manner that reduces peak intensity errors generated by the gray tone/level algorithms used to generate and use a Mask 20 of the present invention.

Figure 11:
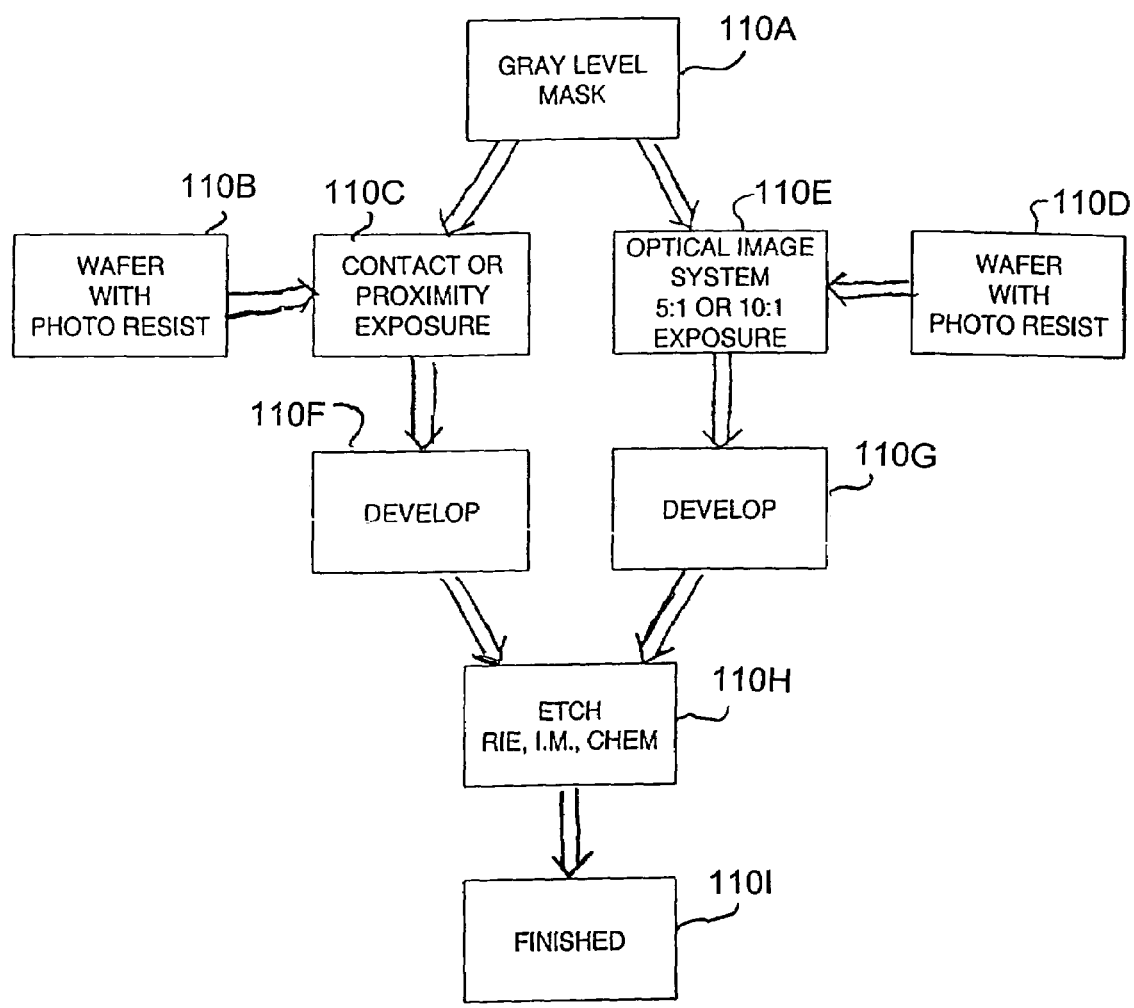
FIG. 11 is a flow diagram illustrating a method for using a gray level mask of the present invention in standard semiconductor processes.

In this regard, and for example, FIG. 11 is a flow diagram illustrating a method for using a gray level mask resulting from the process of FIG. 10 in standard semiconductor processes. As indicated therein, a gray level mask is selected in initial Step 110A and then, in either Steps 110B and 110C or in Steps 110D or 110E, a wafer is prepared with a photo-resist and exposed with the mask and the exposed wafer is developed in one of Steps 110F or 110G. The developed wafer is then etched in Step 110H, and is finished in Step 110I.

Figure 12:
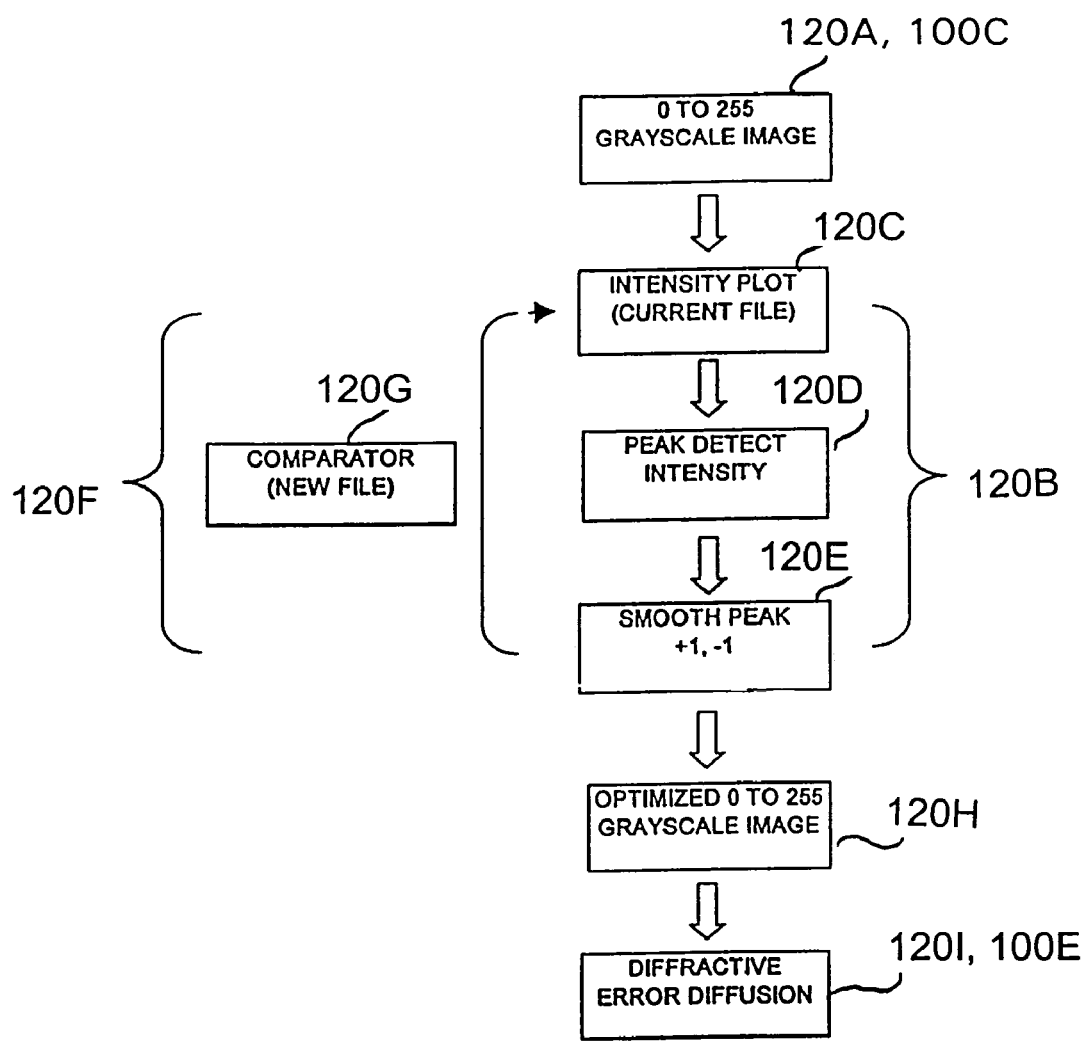
FIG. 12 is a flow diagram illustrating a method for diffractive intensity averaging as used in and with the present invention.

Considering the process illustrated in FIG. 10 in further detail, FIG. 12 is a flow diagram illustrating a method for diffractive intensity averaging as used in and with the present invention, as in Step 100D of the process illustrated in FIG. 10. As shown in FIG. 12, the diffractive intensity averaging process begins at Step 120A with a grayscale image of the desired mask. The mask image is then processed according to the diffractive intensity averaging algorithm in Step 120B, which is comprised of a Step 120C in which an intensity plot is generated from the current file version of the grayscale image, a Step 120D in which the peak intensity in the image is detected, and a Step 120E in which the image intensity peak or peaks is smoothed. At each of Steps 120C, 120D and 120E the current results of the intensity processing are compared in a Step 120G to the results of a previous reiteration of the process comprising Steps 120C, 120D and 120E, and the sequence of Steps 120C, 120D and 120E are reiterated until the comparison indicates that the results of the current iteration are within the desired limits. The results of Step 120B are then optimized to a grayscale image in a Step 120H, and passed to a Step 120I in which a diffractive error diffusion process is performed.

Figure 13:
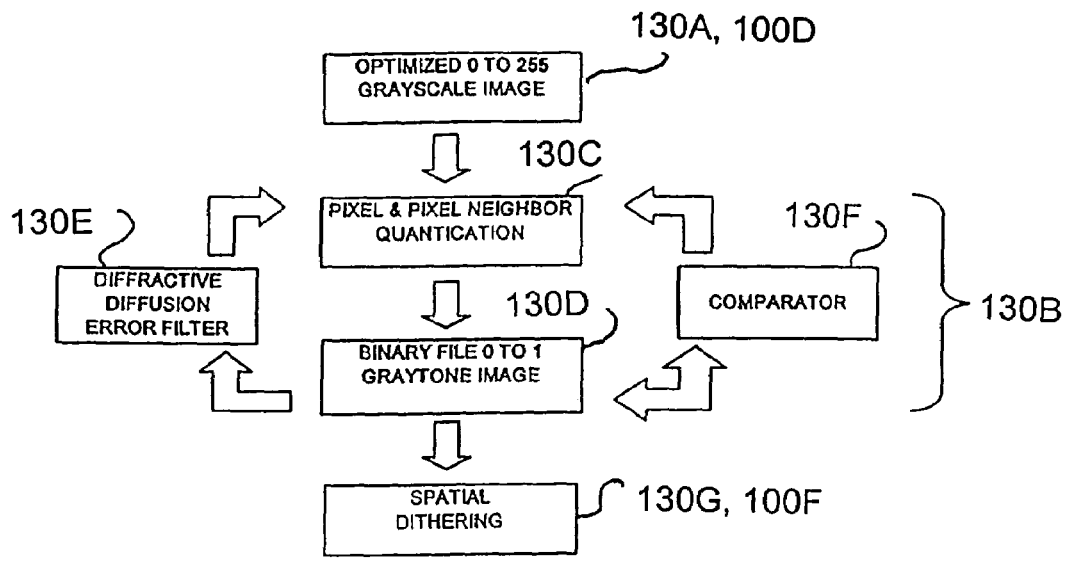
FIG. 13 is a flow diagram illustrating a method for determining diffractive error diffusion as used in and with the present invention.

FIG. 13 is a flow diagram illustrating a method for the diffractive error diffusion process referred to as Step 100E in FIG. 10 and as the next processing step after the diffractive intensity process illustrated in FIG. 12. In Step 130A the diffractive error diffusion process receives the optimized grayscale image from the diffractive intensity averaging process described with reference to FIG. 12 and is processed through the Diffractive error diffusion algorithm of Step 130B. As indicated in FIG. 13, the diffractive error diffusion algorithm beings with a Step 130C in which a pixel and pixel neighbor quantification process is performed on each pixel of the image. The results of Step 130C are then converted to a binary graytone image in Step 130, and in a Step 130E the results are examined through a diffractive diffusion error filter with the image being returned to Step 130C if necessary. The binary graytone image is also compared to the original image in a Step 130F, and the results employed in the pixel quantification process of Step 130C. When the process of Step 130B is completed for a given grayscale image, the results of the process are passed in a Step 130G to the spatial dithering process previously identified as Step 100G in FIG. 10.

Figure 14:
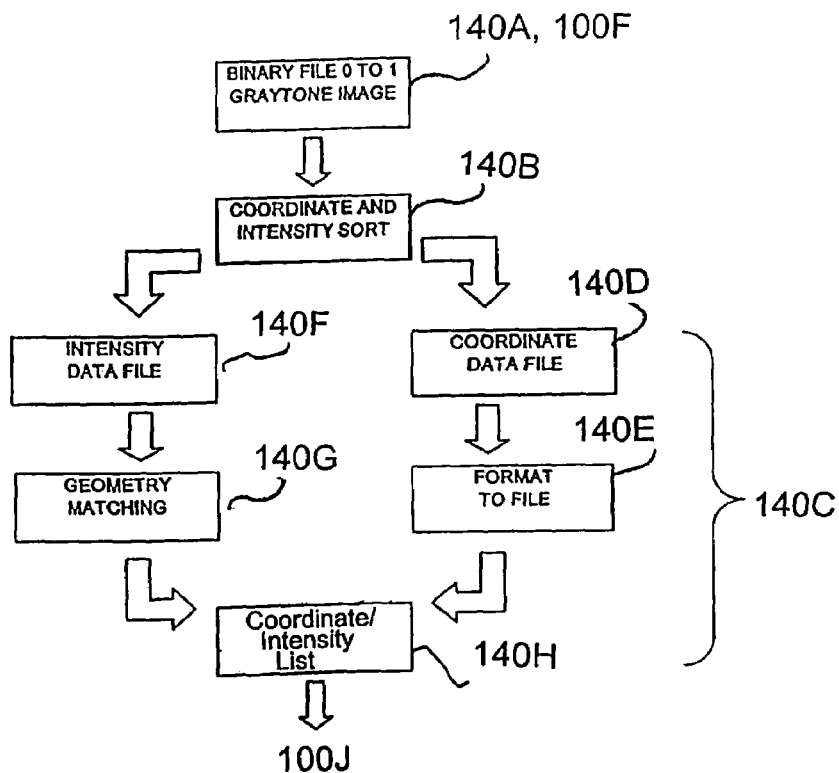
FIG. 14 is a flow diagram illustrating a method for diffractive spatial dithering as used in and with the present invention.

FIG. 14 is a flow diagram illustrating a method for diffractive spatial dithering generally identified as Step 100G in FIG. 10. As shown in FIG. 14, the diffractive spatial dithering process beings at Step 140A with the receiving of a graytone image file from Step 100F. In Step 140B the process sorts the graytone image data according to coordinates within the mask and the intensity of the image at each coordinate therein. Step 140C, the diffractive spatial dithering algorithm, is comprised of Steps 140D and 140E in which the process constructs a coordinate data file identifying the various coordinate points within the map and formats the coordinate information into a file format. Step 140C also includes Steps 140F and 140G which are performed in paralle with Steps 140D and 140E and in which an intensity data file is constructed containing intensity data for each coordinate point identified in the coordinate data file and in which the intensity data file entry corresponding to each identified coordinate is comprised of the results of an intensity dithering operation performed on the pixel at the coordinate point and the intensities of selected surrounding pixels, the surrounding pixels being determined according to the dithering process. Then in Step 140H, the coordinate and intensity data generated in Step 140C is constructed into a coordinate and intensity list, that is, a coordinate and intensity data file, which is passed to Step 100J of the process illustrated in FIG. 10.

Since certain changes may be made in the above described method and system for generating and using the masks of the present invention and in the masks of the present invention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method for generating an optical element, comprising the steps of:
    generating a desired grayscale pattern of an initial grayscale mask, and forming a mask layer on a transparent layer of a substrate by
    printing the grayscale pattern of the initial grayscale mask onto the transparent layer of the substrate as a photoresist layer by one of proximity exposure, contact exposure and optical imaging to generate a corresponding photoresist pattern, wherein
        the mask layer has a plurality of apertures therethrough forming a mask pattern for the transmission of radiation through the mask to form a grayscale image on a workpiece, each edge of each aperture including a plurality segments forming a serrated edge, the segments being dimensioned to result in mixed edge diffraction of the radiation being transmitted through the apertures.

2. The method of claim 1, wherein the optical element is a refractive optical element.

3. The method of claim 1 for generating an optical element, wherein:
    the substrate further includes an absorptive layer and at least a part of the photoresist pattern is transferred into the absorptive layer.

4. The method of claim 1 for generating an optical element, wherein:
    the substrate further include a reflective layer and at least a part of the photoresist pattern is transferred into the reflective layer.

5. The method of claim 1 for generating an optical element, wherein:
    the substrate further includes an absorptive layer and a reflective layer and at least a first part of the photoresist pattern is transferred into the absorptive layer and at least a second part of the photoresist pattern is transferred into the reflective layer.

6. The method for generating an optical element of claim 1, wherein the method further comprises a transferring step for etching the photoresist pattern into the substrate.

7. The method of claim 1 for generating an optical element further comprising the step of:
    forming a random diffusing layer located on a side of the substrate opposite to the mask layer for diffusing at least one of linear edge diffraction and mixed edge diffraction effects in the radiation passing through the mask layer, the substrate layer and the diffusing layer.

8. A method for generating an optical element, comprising the steps of:
    forming a mask layer by generating a desired grayscale pattern in a layer of mask material on an initial grayscale mask, wherein
        the layer of mask material has a variable amplitude transmission in accordance with a desired continuous level phase transmittance function, and
        the mask layer has a plurality of apertures therethrough forming a mask pattern for the transmission of radiation through the mask to form a grayscale image on a workpiece, each edge of each aperture including a plurality segments forming a serrated edge, the segments being dimensioned to result in mixed edge diffraction of the radiation being transmitted through the apertures,
    printing the grayscale pattern of the initial grayscale mask onto a photoresist layer by one of contact exposure or proximity exposure to generate a photoresist pattern, and
    transferring the photoresist pattern into a selected substrate to form an optical element having the grayscale pattern.

9. The method for generating an optical element of claim 8, wherein the transferring step includes etching the photoresist pattern into the substrate.

10. The method for generating an optical element of claim 8, wherein:
    the transferring step includes the step of generating a master element from the photoresist pattern, and
    the step of forming the optical element includes injection molding of the substrate with the master element.

11. The method of claim 8 for generating an optical element further comprising the step of:
    forming a random diffusing layer located on a side of the substrate opposite to the mask layer for diffusing at least one of linear edge diffraction and mixed edge diffraction effects in the radiation passing through the mask layer, the substrate layer and the diffusing layer.

* * * * *